United States Patent
Rohilla

(10) Patent No.: US 8,762,632 B2
(45) Date of Patent: Jun. 24, 2014

(54) INCOMING BUS TRAFFIC STORAGE SYSTEM

(75) Inventor: Sandeep Rohilla, Noida (IN)

(73) Assignee: STMicroelectronics International N.V., Amsterdam (NL)

(*) Notice: Subject to any disclaimer, the term of this patent is extended or adjusted under 35 U.S.C. 154(b) by 249 days.

(21) Appl. No.: 13/336,342

(22) Filed: Dec. 23, 2011

(65) Prior Publication Data

US 2013/0166851 A1 Jun. 27, 2013

(51) Int. Cl.
*G06F 12/00* (2006.01)

(52) U.S. Cl.
USPC .......................................... 711/104; 711/154

(58) Field of Classification Search
None
See application file for complete search history.

(56) References Cited

U.S. PATENT DOCUMENTS

2010/0054012 A1* 3/2010 Srinivasan et al. ......... 365/49.17

* cited by examiner

*Primary Examiner* — Shawn X Gu
(74) *Attorney, Agent, or Firm* — Hogan Lovells US LLP

(57) ABSTRACT

In managing incoming bus traffic storage for store cell memory (SCM) in a sequential-write, random-read system, a priority encoder system can be used to find a next empty cell in the sequential-write step. Each cell in the SCM has a bit that indicates whether the cell is full or empty. The priority encoder encodes the next empty cell using these bits and the current write pointer. The priority encoder can also find next group of empty cells by being coupled to AND operators that are coupled to each group of cells. Further, a cell locator selector selects a next empty cell location among priority encoders for cell groups of various sizes according to an opcode by appending '0's to cell locations outputs from priority encoders that are smaller than the size of the SCM.

21 Claims, 5 Drawing Sheets

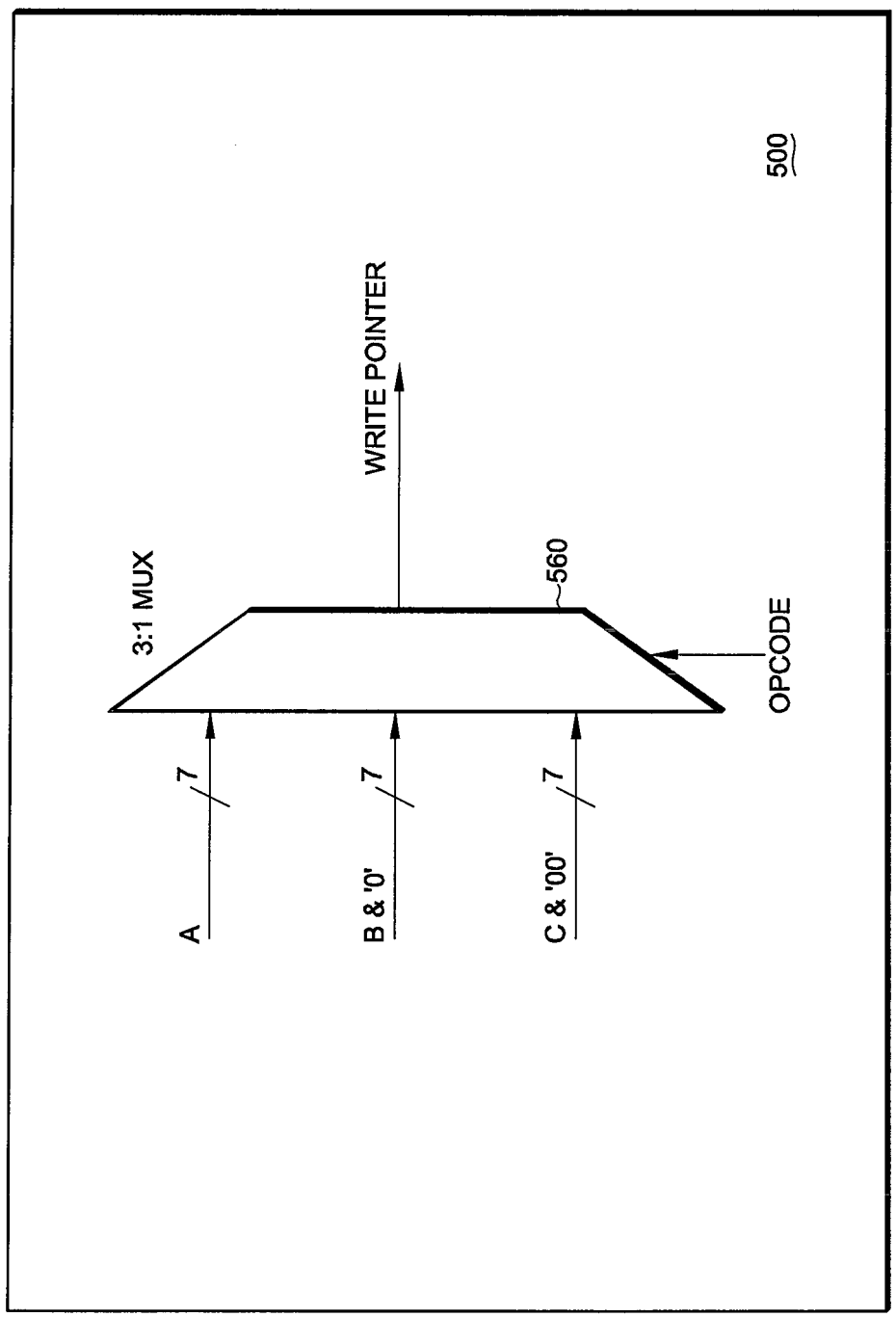

INCOMING BUS TRAFFIC STORAGE SYSTEM

BACKGROUND OF THE INVENTION

1. Field of the Invention

The present invention relates, in general, to store cell memory storage, and, more particularly, to managing incoming bus traffic storage for store cell memory.

2. Relevant Background

There is a need in the art for improved store cell memory storage.

SUMMARY OF THE INVENTION

Briefly stated, the present invention involves managing incoming bus traffic storage for store cell memory in a sequential-write, random-read system.

According to an embodiment of the invention, a store cell memory storage system comprises a store cell memory comprising a plurality of cells and a priority encoder coupled to the store cell memory, wherein the priority encoder selects a next empty cell in the store cell memory.

According to another embodiment of the invention, a store cell memory storage system comprises a store cell memory comprising a plurality of cells, a group of AND operators each coupled to a group of neighboring cells, and a priority encoder coupled to the AND operators, wherein the priority encoder selects a next group of empty cell location in the store cell memory. In another aspect of an embodiment of the invention, the store cell memory storage system further comprises a plurality of groups of AND operators each coupled to a group of neighboring cells, and a plurality of priority encoders each coupled to a group of AND operators, wherein each priority encoder selects a next group of empty cell locations in the store cell memory. In a further aspect of an embodiment of the invention, the store cell memory storage system further comprises a cell location selector comprising a multiplexer configured to select the next group of empty cell location between the priority encoder and the second priority encoder according to an opcode.

According to a further embodiment of the invention, a cell location selector comprises a multiplexer configured to select a next cell location among a plurality of priority encoders according to an opcode, wherein, if cell locations outputted by the priority encoders have a size less than a predetermined size, '0's are appended to the end of the cell locations.

BRIEF DESCRIPTION OF THE DRAWINGS

FIG. 5 illustrates a cell location selector according to an embodiment of the invention.

DETAILED DESCRIPTION OF THE PREFERRED EMBODIMENTS

Embodiments of the present invention are hereafter described in detail with reference to the accompanying figures and are provided for purposes of illustration only and not for the purpose of limiting the invention as defined by the appended claims and their equivalents. Descriptions of well-known functions and constructions are omitted for clarity and conciseness. The figures are meant to illustrate features of exemplary embodiments of the invention and are not drawn to scale.

A detailed description of the present invention follows, utilizing the accompanying drawings as referenced by the Figures. The preferred embodiments are referenced as each figure is addressed.

Figure 1:
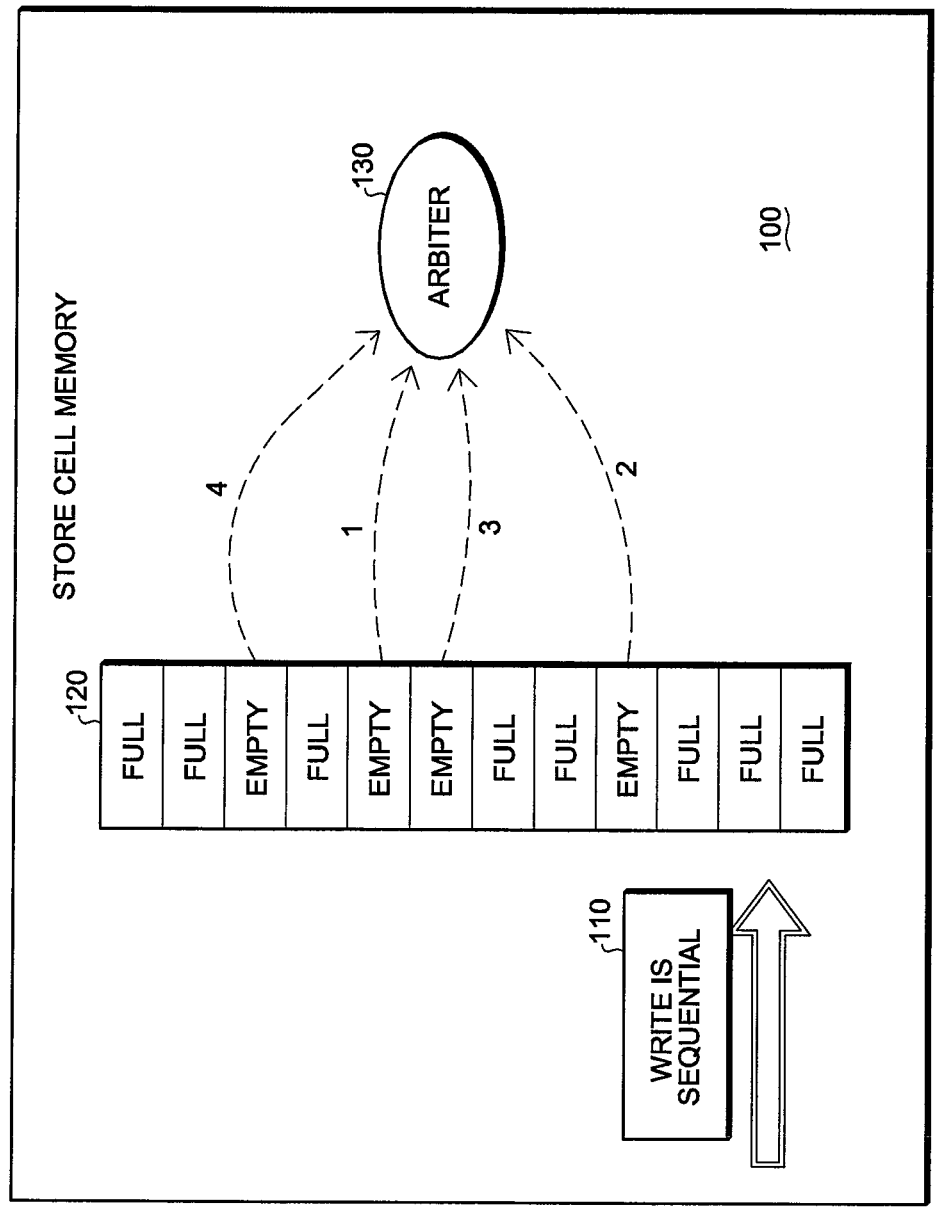
FIG. 1 illustrates an exemplary store cell memory system.

FIG. 1 illustrates an exemplary store cell memory system. The store cell memory system 100 comprises a plurality of store cells in a store cell memory (SCM) 120, a write pointer 110, and an arbiter 130. SCM 120 is used to store the cells to be written to a memory, i.e., a DDR memory, through arbiter 130.

The state of a cell in SCM 120 can be determined using a bit that is '1' when the location is empty and '0' when the location is full. Writing to SCM 120 is sequential, while reading from SCM 120 is random. Write pointer 110 indicates the current cell in the sequence for a write. Write pointer 110 starts from cell zero in SCM 120, goes to the max cell and then wrap back to cell zero. Write pointer 110 is stuck if the next location is not empty; for example, write pointer 110 currently points to the max cell; however, cell zero is not empty; therefore, write pointer 110 will not wrap back to cell zero until it becomes empty. Incoming traffic will be stalled until cell zero is read by the arbiter. Further, incoming packet can consist of data sizes fitting 1 cell, 2 cells, 4 cells, or other sizes.

Figure 2:
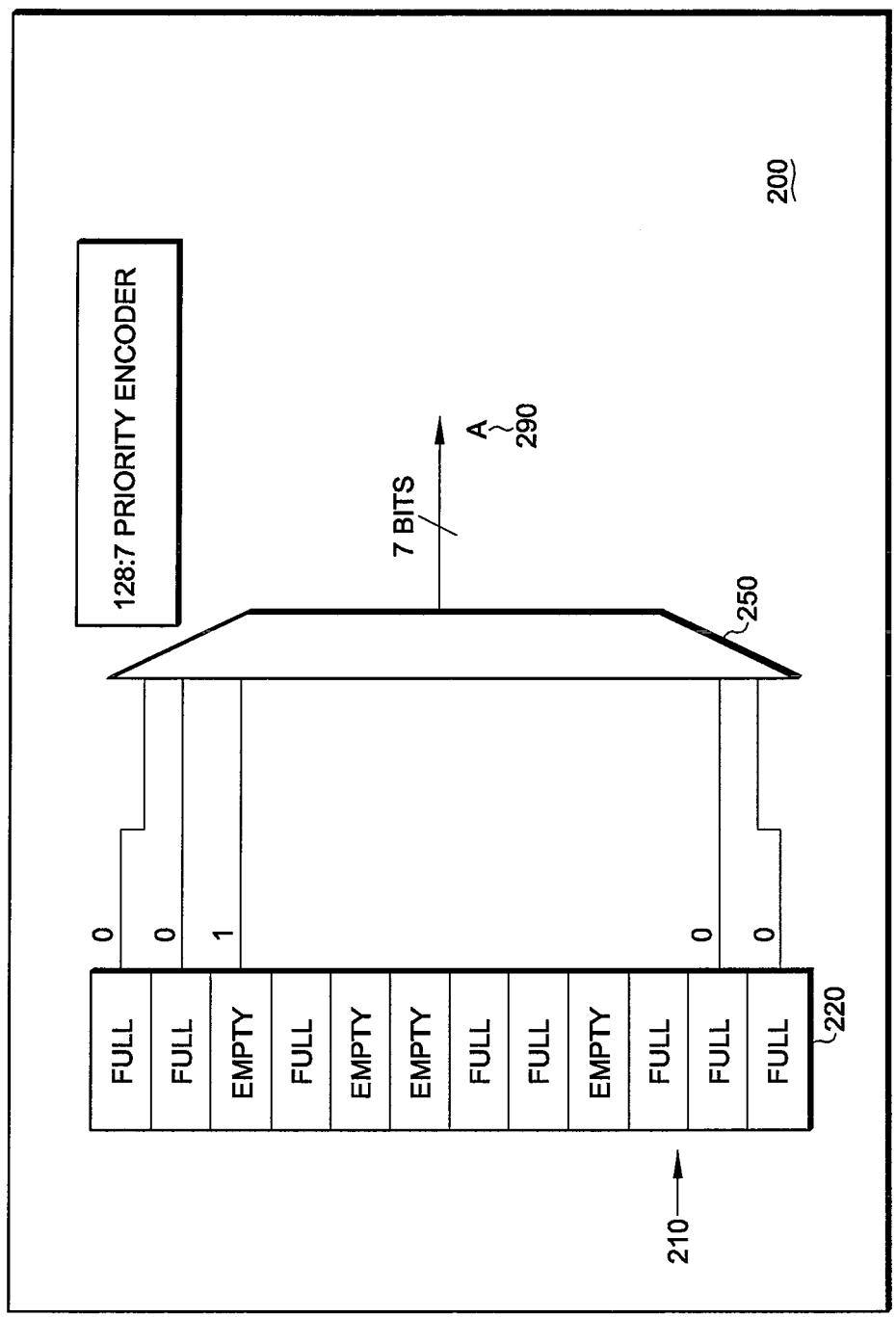
FIG. 2 illustrates a priority encoder system for a single store cell according to an embodiment of the invention.

FIG. 2 illustrates a priority encoder system for a single store cell according to an embodiment of the invention.

Priority encoder system 200 comprises SCM 220, 128:7 priority encoder 250 and has a 7-bits output. Note that for illustration purposes, SCM 220 has 128 single cell locations, which matches 128:7 priority encoder 250. The same approach can be extended for fewer cell locations, i.e., 64, 32, 16, etc., and for more cell locations, i.e., 256, 512, 1024, etc.

In priority encoder system 200, the bits representing the empty/full state of a cell location for each cell in SCM 220 are inputted to 128:7 priority encoder 250. Suppose that write pointer 210 starts at the position as indicated. The next cell and the last cell are indicated as full, and the cell location wraps around to cell zero, and the next available empty cell is the third cell from the top. Therefore, priority encoder 250 is configured output a 7-bits value 290 representing the location of this third cell from the top as the next empty cell. Further, an opcode 'A' will be attached to this operation to indicate that system 200 is for a single store cell.

Figure 3:
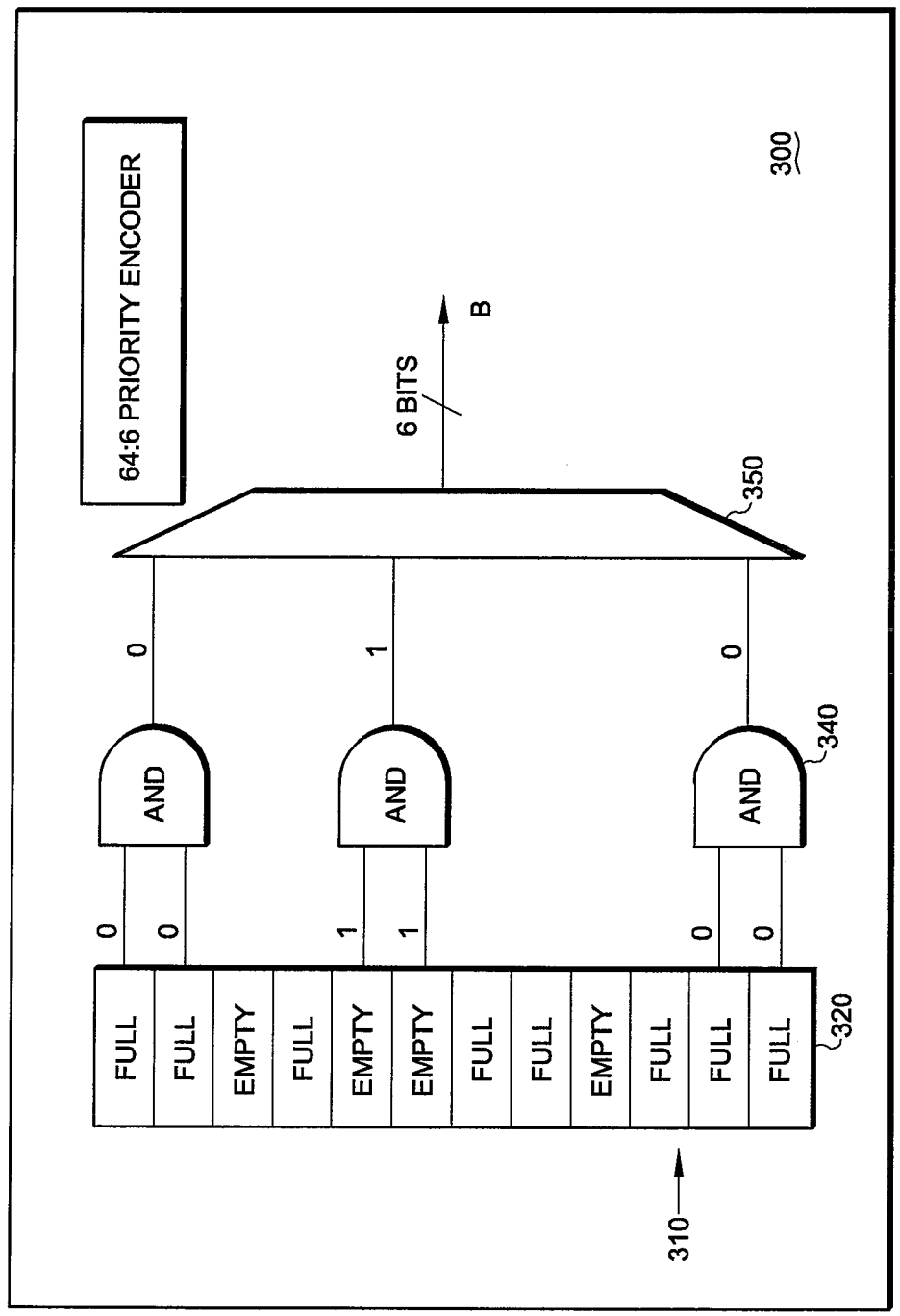
FIG. 3 illustrates a priority encode system for two store cells according to an embodiment of the invention.

FIG. 3 illustrates a priority encode system for two store cells according to an embodiment of the invention.

Priority encoder system 300 comprises SCM 320, AND operators 340, and 64:6 priority encoder 350 and has a 6-bits output. Note that for illustration purposes, SCM 320 has 128 single cell locations or 64 two cells locations, which matches 64:6 priority encoder 350. The same approach can be extended for fewer cell locations, i.e., 64, 32, 16, etc., and for more cell locations, i.e., 256, 512, 1024, etc.

In priority encoder system 300, the bits representing the empty/full state of a cell location for each cell in SCM 320 and a neighboring cell are inputted to the AND operators 340, and the result of AND operators 340 are inputted to 64:6 priority encoder 350. Therefore, only when a cell and its neighboring cell are empty will the corresponding AND operator output a '0' representing the empty state of both cells.

Suppose that write pointer 310 starts at the position as indicated. The next cell and the last cell is indicated as full, and the cell location wraps around to cell zero. The next available empty double cells are the fifth and sixth cells from the top. Therefore, priority encoder 350 is configured output a 6-bits value representing the location of these fifth and sixth cells from the top as the next empty double cells. Further, an opcode 'B' will be attached to this operation to indicate that system 300 is for a two store cell.

Figure 4:
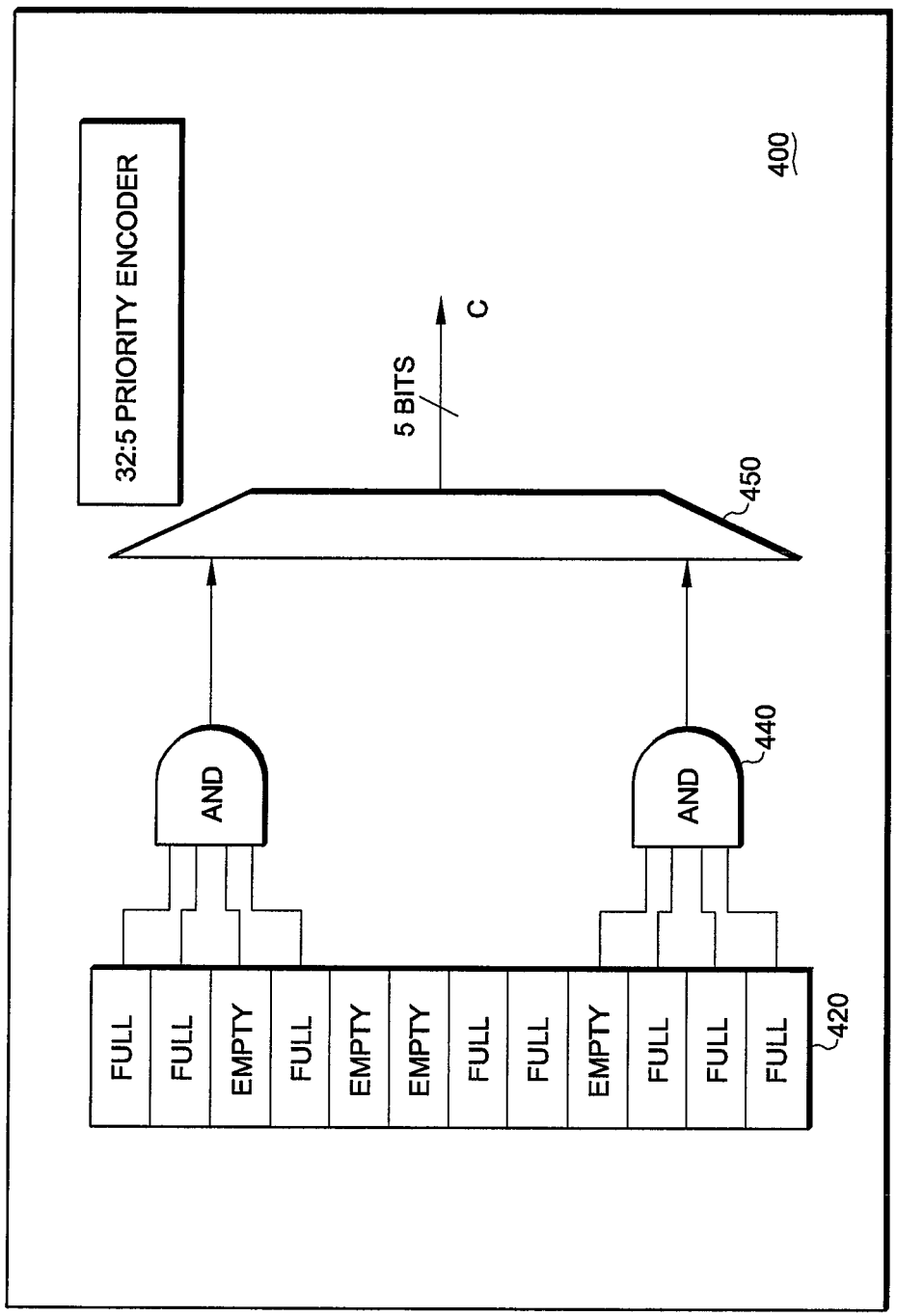
FIG. 4 illustrates a priority encode system for four store cells according to an embodiment of the invention.

FIG. 4 illustrates a priority encode system for four store cells according to an embodiment of the invention.

Priority encoder system 400 comprises SCM 420, AND operators 440, and 32:5 priority encoder 450 and has a 5-bits output. Note that for illustration purposes, SCM 420 has 128 single cell locations or 32 four cells locations, which matches 32:5 priority encoder 450. The same approach can be extended for fewer cell locations, i.e., 64, 32, 16, etc., and for more cell locations, i.e., 256, 512, 1024, etc.

In priority encoder system 400, the bits representing the empty/full state of a cell location for each cell in SCM 420 and a neighboring cell are inputted to the AND operators 440, and the result of AND operators 440 are inputted to 32:5 priority encoder 450. Therefore, only when a cell and its group of three neighboring cells are empty will the corresponding AND operator output a '0' representing the empty state of the four cells.

FIG. 5 illustrates a cell location selector according to an embodiment of the invention.

Cell location selector 500 comprises 3:1 mux 560. 3:1 mux 560 selects inputs from various priority encoders that encodes base on 1, 2, or 4 store cells according to an assigned opcode. Since the input locations for the 2 and 4 store cells contain less bits than the input location for the 1 store cell, '0's are added, using a left-shift of other methods, to the inputs to ensure that the absolute location of the cell is correctly pointed. Thus, the output of 3:1 mux 560 is the correct location for the write pointer to the next empty cell. It is further noted that the 3:1 mux can be modified to support more or less groups of store cells, i.e., 8, 16, etc.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A store cell memory storage system, comprising:
a store cell memory comprising a plurality of cells;
a group of AND operators each coupled to a group of neighboring cells;
a priority encoder coupled to the AND operators, wherein the priority encoder selects a next group of empty cell locations in the store cell memory;
a second group of AND operators each coupled to a second group of neighboring cells; and
a second priority encoder coupled to the second group of AND operators, wherein the second priority encoder selects a next group of empty cell locations in the store cell memory.

2. The store cell memory storage system of claim 1, further comprising a bit for each cell, wherein each bit corresponds to a state of the corresponding cell as empty or full.

3. The store cell memory storage system of claim 1, further comprising a write pointer pointing to a current cell, wherein writes to the store cell memory are sequential.

4. The store cell memory storage system of claim 1, further comprising an arbiter coupled to the priority encoder.

5. The store cell memory storage system of claim 1, wherein the store cell memory comprises 128 cells, wherein each group of neighboring cells contains two cells, and wherein the priority encoder is a 64:6 priority encoder.

6. The store cell memory storage system of claim 1, wherein the store cell memory comprises 128 cells, wherein each group of neighboring cells contains four cells, and wherein the priority encoder is a 32:5 priority encoder.

7. The store cell memory storage system of claim 1, wherein reads from the store cell memory is random.

8. The store cell memory storage system of claim 1 wherein a size of the group of neighboring cells coupled to the group of AND operators is different from the second group of AND operators.

9. The store cell memory storage system of claim 1, further comprising a cell location selector comprising a multiplexer configured to select a next group of empty cell locations between the priority encoder and the second priority encoder according to an opcode.

10. The store cell memory storage system of claim 9, wherein, if cell locations outputted by the priority encoders have a size less than a size of the store cell memory, '0's are appended to the end of the cell locations.

11. A cell location selector, comprising a multiplexer configured to select a next cell location among a plurality of priority encoders according to an opcode, wherein, if cell locations outputted by the priority encoders have a size less than a predetermined size, '0's are appended to the end of the cell locations.

12. A store cell memory storage system, comprising:
a store cell memory comprising a plurality of cells;
a group of AND operators each coupled to a group of neighboring cells;
a priority encoder coupled to the AND operators, wherein the priority encoder selects a next group of empty cell locations in the store cell memory;
a plurality of groups of AND operators each coupled to a group of neighboring cells; and
a plurality of priority encoders each coupled to a group of AND operators, wherein each priority encoder selects a next group of empty cell locations in the store cell memory.

13. The store cell memory storage system of claim 12, further comprising a bit for each cell, wherein each bit corresponds to a state of the corresponding cell as empty or full.

14. The store cell memory storage system of claim 12, further comprising a write pointer pointing to a current cell, wherein writes to the store cell memory are sequential.

15. The store cell memory storage system of claim 12, further comprising an arbiter coupled to a priority encoder.

16. The store cell memory storage system of claim 12, wherein the store cell memory comprises 128 cells, wherein each group of neighboring cells contains two cells, and wherein a priority encoder is a 64:6 priority encoder.

17. The store cell memory storage system of claim 12, wherein the store cell memory comprises 128 cells, wherein each group of neighboring cells contains four cells, and wherein a priority encoder is a 32:5 priority encoder.

18. The store cell memory storage system of claim 12, wherein reads from the store cell memory are random.

19. The store cell memory storage system of claim 12 wherein a size of the group of neighboring cells coupled to each group of AND operators is different from other groups of AND operators.

20. The store cell memory storage system of claim 12, further comprising a cell location selector comprising a multiplexer configured to select a next group of empty cell locations among the plurality of priority encoders according to an opcode.

21. The store cell memory storage system of claim 20, wherein, if cell locations outputted by the plurality of priority encoders have a size less than a size of the store cell memory, '0's are appended to the end of the cell locations.

* * * * *